United States Patent [19]
Rapp

[11] 3,936,397
[45] Feb. 3, 1976

[54] SEMICONDUCTIVE GLASS-CERAMIC ARTICLES

[75] Inventor: James E. Rapp, Oregon, Ohio

[73] Assignee: Owens-Illinois, Inc., Toledo, Ohio

[22] Filed: Feb. 1, 1974

[21] Appl. No.: 438,567

[52] U.S. Cl.............. 252/518; 106/47 R; 252/63.2; 252/62.9
[51] Int. Cl.².... H01B 1/06; H01B 3/02; H01B 3/08
[58] Field of Search .......... 252/518, 519, 520, 63.2; 106/47 R

[56] References Cited
UNITED STATES PATENTS

| | | | |
|---|---|---|---|
| 3,518,209 | 6/1970 | Provance ........................... | 106/47.1 |
| 3,520,831 | 7/1970 | Trap et al. ........................ | 252/518 |
| 3,829,303 | 8/1974 | Zeto et al. ........................ | 252/518 |

OTHER PUBLICATIONS
"Dieletric Properties of Glasses in the Systems $B_2O_3$ C–dO $SiO_2$, Big $O_3$ CdO $B_2O_3$ and $B_2O_3$CdO $GeO_2$ and Their Relation to the Structure of Glass," by Bh. V. Janakirama Rao Journal of the American Ceramic Society, Vol. 45, No. 11 (1962) 555–563.

Primary Examiner—Benjamin R. Padgett
Assistant Examiner—Josephine Lloyd
Attorney, Agent, or Firm—Howard G. Bruss, Jr.; E. J. Holler

[57] ABSTRACT

This invention relates to the formation of semiconductive glass-ceramic articles. More particularly, the present invention relates to the formation of semiconductive glass-ceramic articles in the $CdO$—$Bi_2O_3$—$B_2O_3$—$GeO_2$ compositional field having resistivities of less than about $10^9$ ohm-cm.

10 Claims, 1 Drawing Figure

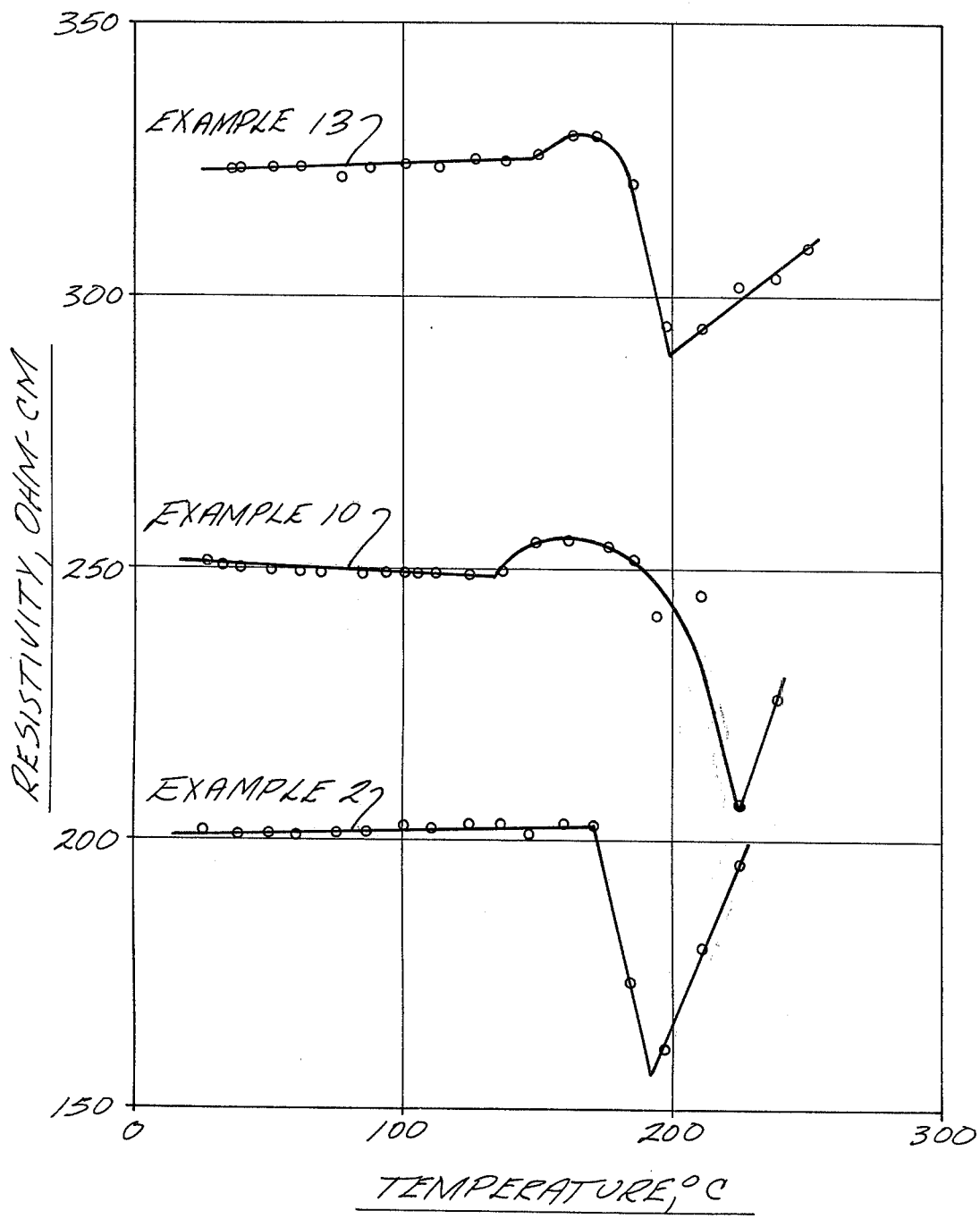

SEMICONDUCTIVE GLASS-CERAMIC ARTICLES

Semiconductors have been known for many years and have utility in many electrical and electronic devices such as rectifiers, transistors, photodiodes, electrical and solar cells, and radiation detectors. Semiconductors are also used in forming components in printed circuits.

In the past, semiconductive ceramics have been formed by conventional ceramic forming processes such as the "press and sinter" technique. U.S. Pat. Nos. 3,372,120, 3,673,119, and 3,719,531 and the article, "Effect of Heat Treatment on the Electrical Conductivities of Materials of the System CdO — $Bi_2O_3$" by Kh. S. Valeev and E. G. Baklanov; Inorganic Materials, 7 (1971) 1302–03, are representative of this technology. While these techniques are suitable for many applications, precise and uniform control of the semiconductive properties is difficult to achieve and maintain due to the inhomogeneities that often form at the grain boundaries in these pressing sintering operations. Furthermore, voids and other defects that are normally associated with a pressed and sintered ceramic product can be detrimental to the functioning of a semiconductive device constructed from such a semiconductive ceramic. Semiconductive glass-ceramics have been studied in the past such as the $V_2O_5-P_2O_5$ glass-ceramics described in the article, "Semiconducting Glass-Ceramics" by L. L. Hench appearing in the Journal of Non-Crystalline Solids, 2 (1970) at pp. 250–277. This article does not concern the compositions of invention.

Glasses containing bismuth and cadmium have been studied in the past. For instance, the article, "Dielectric properties of Glasses in the Systems $Bi_2O_3$—CdO—$SiO_2$, $Bi_2O_3$—CdO—$B_2O_3$, and $Bi_2O_3$—CdO—$GeO_2$ and their Relation to the Structure of Glass" by Bh. V. Janakirama Rao; Journal of the American Ceramic Society, Vol. 45, No. 11 (1962) 555–63, discloses certain neoceramic glasses having high dielectric constants and low dissipation factors for use in the manufacture of capacitors. The article discloses certain bismuth cadmium borates and bismuth silicates which have resistivities which decreases with increasing temperatures in a pattern similar to silicate glasses, but does not disclose or suggest the unusual and unexpected semiconductive properties obtained by the glass-ceramics of the present invention.

Accordingly, it is an object of the present invention to provide an improved semiconductive glass-ceramic article and a practical method for formation thereof.

In attaining the objects of this invention, one feature resides in the thermal crystallization of a homogeneous, thermally crystallizable parent glass composition to form a semiconductive glass-ceramic body having a resistivity of less than about $10^9$ ohm-cm at 25°C, such semidonductive glassceramics can have a resistivity of less than about $10^6$ or even less than $10^4$ ohm-cm if such resistivity is desired or required for the application at hand, said parent glass consisting essentially of:

| Component | Mole % |
|---|---|
| CdO | 50.0–62.0 |
| $Bi_2O_3$ | 17.5–29.0 |
| $B_2O_3$ | 15.2–19.5 |
| $GeO_2$ | 2.0–6.0 | said $B_2O_3$ and $GeO_2$ being present in the following mole % relationship:
A. when $B_2O_3$ is 15.2 to <16.5 then $GeO_2$ is 3.5 to 6.0

| Component | -continued Mole % |
|---|---|
| B. when $B_2O_3$ is 16.5 to <17.5 then $GeO_2$ is 2.0 to 6.0 | |
| C. when $B_2O_3$ is 17.5 to 19.5 then $GeO_2$ is 2.0 to 4.0 | |

Another feature of the invention resides in forming a molten parent glass and casting or otherwise forming the parent glass into the desired shape, and in-situ thermally crystallizing the shaped mass by heat treatment to produce a semiconductive glass-ceramic body.

Other objects, features, and advantages of this invention will become apparent from the following description.

The drawing is a graph illustrating the resistivity in ohm-cm as a function of temperature for several of the exemplary compositions.

The term "glass-ceramic" is used herein according to its conventional meaning and refers to a nonporous, semicrystalline ceramic body which is composed of at least one crystalline phase uniformly dispersed as fine crystals in random orientation in a residual glassy phase or matrix. Such crystalline phase is formed by the in-situ thermal crystallization of a parent glass composition.

The parent glass compositions can be melted in the normal manner in gas-fired furnaces, preferably using slightly oxidizing conditions, or in electric furnaces from normal, common batch materials. Electric boosting can be provided in gas-fired furnaces where desired. In the laboratory, platinum crucibles can be used. In larger furnaces, high quality refractories are employed, such as high alumina refractories.

In making the parent glass compositions, batch ingredients in the proper proportions in finely divided or powdered form are intimately admixed and then melted in an electric furnace in open platinum crucibles. Melting times are generally in the neighborhood of a few hours although some melts are held for longer times to assure homogeneity. Melting temperatures are generally in the neighborhood of 1,900° to 2,800°F. The batch ingredients can be composed of any materials, either oxides or other compounds that can be converted to the desired oxide compositions in the proper proportions during melting. The use of cadmium oxide, bismuth trioxide, boric acid and germanium oxide is quite satisfactory.

The parent glass compositions of the invention can be crystallized in a number of ways. In one method the parent glass is simply slowly cooled after being cast, pressed, or otherwise formed into the desired shape. During the cooling, crystallization spontaneously takes place to form the semiconductive glass-ceramic body. Such products can often be further heat treated to obtain further crystallization, if desired.

On the other hand, the molten parent glass compositions can be shaped and cooled to form a glass article and then the crystallization effected by a heat treatment comprising nucleation, development and crystallization stages.

The heat treatment process for forming glass-ceramics from a parent glass usually includes a nucleation stage at substantially the temperature of the annealing point (viscosity $10^{13}$ poises) of the parent glass, a development stage at a temperature below the fiber softening point of the parent glass (preferably at a viscosity in the range of $10^8$ to $10^{12}$ poises) and a crystallization stage (at a temperature preferably 150° to 300°F above the fiber softening point of the parent glass (i.e., viscosity of $10^{7.65}$ poises).

In actual practice, it has been found that all three stages of the heating process can be accomplished by continuously advancing the temperature through regions of nucleation, development and crystallization. In many compositions of the present invention, it has been found that a "formal" development stage is not required because the time required to heat the article from the nucleation temperature to the crystallization temperature is sufficient.

In any event, the overall heat treatment chosed results in an at least partially crystalline, semiconductive non-porous, hard, glass-ceramic body whose entire interior contains a multitude of randomly oriented, substantially homogeneously dispersed fine crystals.

As will be understood, when going from the initial or nucleation heat treatment to the higher crystallization temperature, it is usually preferred to proceed slowly enough or to stop at intermediate plateaus long enough, to effect appreciable crystallization in the intermediate temperature range, at least to such a degree that a rigid crystalline network is formed that prevents the article from slumping. Of course, in heat treating articles such as flat plates that can be cast in a mold and heat treated in the mold, the slumping problem is not important and not as much care need be exercised.

In most compositions of invention, the in-situ thermal crystallization of the parent glass to form the semiconductive glass-ceramic article can be accomplished at temperatures in the range of about 900° to about 1300°F for time periods ranging from ¼hour to 16 hours and longer, with the lower temperatures usually requiring the longer time periods. In the usual practice, heat treatments at temperatures of from about 1,000°F to 1,200°F for time periods ranging from about 1 hour to about 5 hours are quite satisfactory.

The principles of the present invention are illustrated in the examples that follow wherein all percentages are mole percentages, all parts are parts by weight, and all temperatures are in °F unless stated otherwise.

EXEMPLARY PROCEDURES

Melting

Glass batches of 500 parts are prepared from conventional glass making ingredients in platinum crucibles at temperatures ranging from about 1,900° to about 2,800°F in an electrically heated furnace depending on the melting characteristics of the particular batch. Because of the very low viscosities encountered at temperatures above the liquidus temperature, melting times of 1 to 5 hours are sufficient in most cases to satisfactorily refine and homogenize the melts.

After melting and refining the molten glass is quenched to avoid uncontrolled crystallization by casting between metal plates at room temperature to obtain homogeneous, thermally crystallizable parent glass samples in the form of chips. The glasses are usually yellow-orange in appearance.

Typical batch proportions in parts by weight for a few of the Examples are set forth below.

| Batch Ingredient | Example 10 | Example 13 | Example 14 |
|---|---|---|---|
| cadmium oxide | 151.0 | 149.4 | 85.7 |
| bismuth trioxide | 219.9 | 218.5 | 96.9 |
| anhydrous boric acid | 22.8 | 23.0 | 14.6 |
| germanium oxide | 7.95 | 10.81 | 4.34 |
| Melting temperature (°F) | 1900 | 1900 | 1900 |
| Melting time (hours) | 2 | 2 | 2 |

Heat Treatments

The glass samples are heat treated to form a semiconductive glass-ceramic body by placing the sample in an electric furnace previously stabilized at the heat treatment temperature indicated in the table and maintaining for the indicated time period. At the end off the heat treatment time, the resulting glass-ceramic samples are withdrawn and rapidly cooled to room temperature. The semiconductive glass-ceramics are either yellowish or black in appearance.

Some of the semiconductive glass-ceramic samples contain sillenite ($\gamma - Bi_2O_3$), as identified by X-ray diffraction analysis as the predominant crystalline phase. Unidentified crystalline phases are sometimes also present in the semiconductive glass-ceramics.

Resistivity

The electrical resistivity in ohm-cm is measured at 25°C for the glass-ceramics produced by the foregoing heat treatments by conventional techniques and is rated as follows in the examples:

| | |
|---|---|
| log resistivity (ohm-cm) of | 2 to <4 are rated A |
| log resistivity (ohm-cm) of | 4 to <6 are rated B |
| log resistivity (ohm-cm) of | 6 to 9 are rated C |

In Examples 2, 10, and 13 the resistivities are measured over the temperature range from 25° to 250°C and the results are presented in the graph in the drawing. For this determination, the heat treatment to produce the semicrystalline glass-ceramic body from the parent glass is 1,150°F for 2 hours in each case.

The graph shows that the resistivity for these examples is less than 350 ohm-cm and varies little with temperature over the range. This data indicate that the semiconductive glass-ceramics are useful in resistor pastes for forming printed circuits as in U.S. Pat. No. 3,681,261 the disclosure of which is incorporated by reference.

The significance of the "dip" in the graph near 200°C is not understood, although it is theorized to be the result of a displacive phase transformation. It is clear, however, that the resistivity is quite different from conventional glasses and ceramics which is in the neighborhood of log $10^{13} - 10^{14}$ at room temperature and then gradually decreases with increasing temperature.

Table I

| Examples | 1 | 2 | 3 | 4 | 5 | 6 | 7 |
|---|---|---|---|---|---|---|---|
| Component | Mole % | | | | | | |
| CdO | 61.5 | 59.3 | 61.8 | 60.8 | 59.6 | 57.7 | 60.4 |
| $Bi_2O_3$ | 19.2 | 18.5 | 18.2 | 17.9 | 17.5 | 19.2 | 18.8 |

Table I-continued

| Examples | 1 | 2 | 3 | 4 | 5 | 6 | 7 |
|---|---|---|---|---|---|---|---|
| $B_2O_3$ | 15.4 | 18.5 | 16.4 | 17.9 | 19.3 | 19.2 | 17.0 |
| $GeO_2$ | 3.9 | 3.7 | 3.6 | 3.6 | 3.5 | 3.9 | 3.8 |
| Resistivity Rating at 25°C | C | A | C | B | C | C | B |
| Heat Treatment °F (hours) | 1150(2) | 1150(2) | 1150(2) | 1150(2) | 1150(2) | 1150(2) | 1150(2) |

| Examples | 8 | 9 | 10 | 11 | 12 | 13 | 14 |
|---|---|---|---|---|---|---|---|
| Component | Mole % | | | | | | |
| CdO | 58.7 | 53.5 | 57.4 | 58.2 | 56.0 | 56.4 | 59.6 |
| $Bi_2O_3$ | 19.6 | 26.8 | 22.9 | 21.1 | 24.9 | 22.6 | 19.9 |
| $B_2O_3$ | 18.0 | 16.0 | 16.0 | 17.0 | 15.4 | 16.0 | 18.0 |
| $GeO_2$ | 3.7 | 3.7 | 3.7 | 3.7 | 3.7 | 5.0 | 2.5 |
| Resistivity Rating at 25°C | A | B | A | A | A | A | A |
| Heat Treatment °F (hours) | 1150(2) | 1150(2) | 1150(2) | 1150(2) | 1150(2) | 1150(2) | 1150(2) |

To further illustrate the crystallizing heat treatment that can be employed to form semiconductive glass-ceramics of invention several of the exemplary parent glass compositions in the form of rods are heat treated for 2 hours in a temperature gradient furnace where the temperature gradually increases from one end of the furnace to the other. This simultaneously provides a variety of heat treatments for each rod.

For the 2 hour heat treatment, the high and low temperature on either end of the gradient that produce semiconductive glass-ceramics having a resistivity of less than $10^6$ ohm-cm is set forth below. Other heat treatment time periods will probably produce different results.

| Example Number | Temperature Span °F |
|---|---|
| 2 | 1100 to 1200 |
| 7 | 1075 to 1150 |
| 8 | 1075 to 1175 |
| 9 | 1175 to 1200 |
| 10 | 1075 to 1200 |
| 11 | 1075 to 1200 |
| 12 | 1075 to 1200 |
| 13 | 1075 to 1150 |
| 14 | 1200 to 1275 |

Having thus described the invention, what is claimed is:

1. A semiconductive, glass-ceramic body having a resistivity of less than about $10^9$ ohm-cm at 25°C prepared by the in-situ, thermal crystallization of a thermally crystallizable glass composition consisting essentially of:

| Component | Mole % |
|---|---|
| CdO | 50.0–62.0 |
| $Bi_2O_3$ | 17.5–29.0 |
| $B_2O_3$ | 15.2–19.5 |
| $GeO_2$ | 2.0–6.0 | said $B_2O_3$ and $GeO_2$ being present in the following mole % relationship:

- A. when $B_2O_3$ is 15.2 to <16.5 then $GeO_2$ is 3.5 to 6.0
- B. when $B_2O_3$ is 16.5 to <17.5 then $GeO_2$ is 2.0 to 6.0
- C. when $B_2O_3$ is 17.5 to 19.5 then $GeO_2$ is 2.0 to 4.0.

2. The semiconductive glass-ceramic body of claim 1 having a resistivity of less than about $10^6$ ohm-cm.

3. The semiconductive glass-ceramic body of claim 1 having a resistivity of less than about $10^4$ ohm-cm.

4. A homogeneous, thermally crystallizable glass composition, thermally in-situ crystallizable to a semiconductive glass-ceramic body, said composition consisting essentially of:

| Component | Mole % |
|---|---|
| CdO | 50.0–62.0 |
| $Bi_2O_3$ | 17.5–29.0 |
| $B_2O_3$ | 15.2–19.5 |
| $GeO_2$ | 2.0–6.0 | said $B_2O_3$ and $GeO_2$ being present in the following mole % relationship:

- A. when $B_2O_3$ is 15.2 to <16.5 then $GeO_2$ is 3.5 to 6.0
- B. when $B_2O_3$ is 16.5 to <17.5 then $GeO_2$ is 2.0 to 6.0
- C. when $B_2O_3$ is 17.5 to 19.5 then $GeO_2$ is 2.0 to 4.0.

5. In the method for forming a semiconductive glass-ceramic article the improvement comprising shaping said article from the glass composition of claim 4 and heat treating said article at a temperature and for a time sufficient to in-situ crystallize a random dispersion of fine crystal in a residual glassy matrix to form a glass-ceramic article having a resistivity of less than about $10^9$ ohm-cm at 25°C.

6. The method of claim 5 wherein said temperature ranges from about 900° to 1,300°F.

7. The method of claim 6 wherein said time period is in the range from about ¼ hour to about 16 hours.

8. The method of claim 7 wherein said temperature is in the range of about 1,000° to 1,200°F and said time period ranges from about 1 hour to about 5 hours.

9. The method of claim 5 wherein said glass-ceramic article has a resistivity of less than about $10^6$ ohm-cm.

10. The method of claim 5 wherein said glass-ceramic article has a resistivity of less than about $10^4$ ohm-cm.

* * * * *